United States Patent [19]

Israelsson et al.

[11] Patent Number: 5,132,279
[45] Date of Patent: Jul. 21, 1992

[54] METHOD FOR DETERMINING TRANSPORT CRITICAL CURRENT DENSITIES AND FLUX PENETRATION DEPTH IN BULK SUPERCONDUCTORS

[75] Inventors: Ulf E. Israelsson, Monrovia; Donald M. Strayer, Altadena, both of Calif.

[73] Assignee: California Institute of Technology, Pasadena, Calif.

[21] Appl. No.: 571,299

[22] Filed: Aug. 22, 1990

[51] Int. Cl.$^5$ .................. H01B 12/00; H01L 39/12
[52] U.S. Cl. .......................... 505/1; 505/726; 505/727; 324/228; 324/262
[58] Field of Search ............ 324/262, 248, 228; 505/1, 842, 843, 726, 727

[56] References Cited

U.S. PATENT DOCUMENTS 4,939,458 7/1990 Yarar et al. ................ 324/228

Primary Examiner—Walter E. Snow
Attorney, Agent, or Firm—Elliott N. Kramsky

[57] ABSTRACT

A contact-less method for determining transport critical current density and flux penetration depth in bulk superconductor material. A compressor having a hollow interior and a plunger for selectively reducing the free space area for distribution of the magnetic flux therein are formed of superconductor material. Analytical relationships, based upon the critical state model, Maxwell's equations and geometrical relationships define transport critical current density and flux penetration depth in terms of the initial trapped magnetic flux density and the ratio between initial and final magnetic flux densities whereby data may be reliably determined by means of the simple test apparatus for evaluating the current density and flux penetration depth.

11 Claims, 2 Drawing Sheets

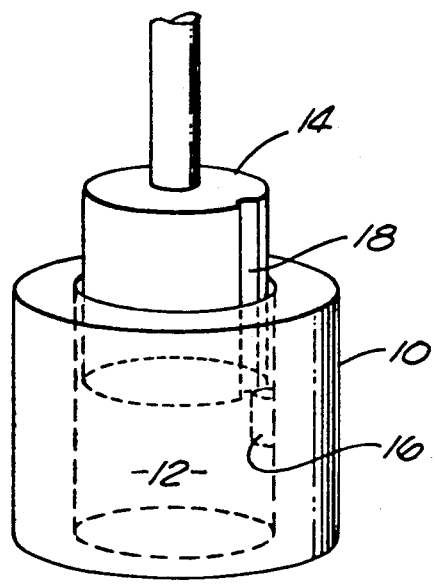
FIG. 1
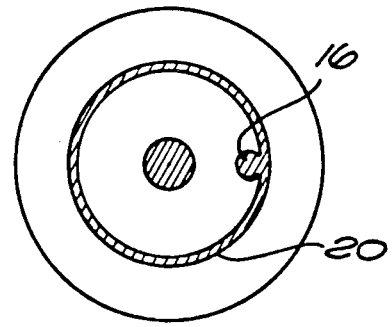
FIG. 2
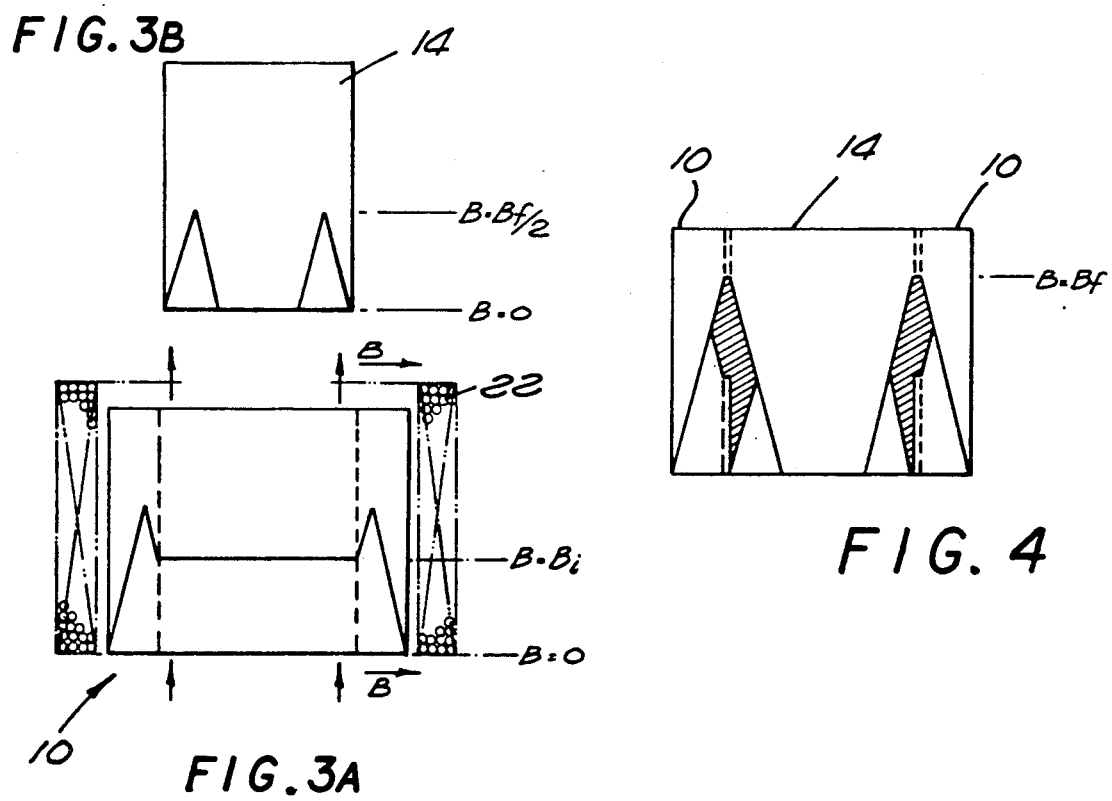
FIG. 3A
FIG. 3B
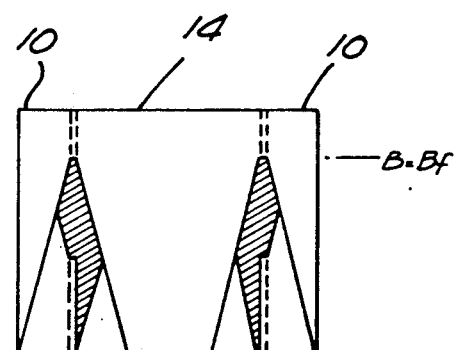
FIG. 4

METHOD FOR DETERMINING TRANSPORT CRITICAL CURRENT DENSITIES AND FLUX PENETRATION DEPTH IN BULK SUPERCONDUCTORS

The invention described herein was made in the performance of work under a NASA contract, and is subject to the provisions of Public Law 96-517 (35 USC 202) in which the Contractor has elected to retain title.

BACKGROUND OF THE INVENTION

The present invention relates to methods for determining parameters that significantly effect the design of superconducting devices. More particularly, this invention pertains to an improved method for measuring transport critical current density and flux penetration depth in bulk superconductors.

Superconductors constitute a new generation of materials that promise exciting developments in various fields including transportation (e.g. propulsion systems for levitating trains), magnetohydrodynamic power (e.g. propellerless submarines), ore separation, magnetic shielding, and medical instrumentation (e.g. magnetic resonance imaging).

So-called superconducting materials are characterized by an absence of resistance to the flow of charge that characterizes electrical current. As a result, such materials potentially provide very strong magnetic properties in relatively small packages. Since large electrical currents can pass through such materials, superconductors can become extremely strong and efficient electromagnets.

Initial development of superconducting materials was hampered in terms of economic feasibility by the requirement of extremely low operating temperatures. The initial superconducting materials, such as niobium, required a degree of cooling that mandated the use of liquid helium to achieve superconductivity. More recently, high temperature superconductors (HTS) of ceramic composition have been developed that extend this temperature range to 40 degrees Kelvin and above. An example of such an HTS material is $YBa_2Cu_3O_7$. Such ceramic materials function effectively in the presence of a liquid nitrogen cooling bath thereby achieving economies and feasibility well beyond that of the initial generation of superconductors.

Two parameters essential to the optimal design of devices fabricated of superconducting materials are transport critical current density and flux penetration depth. The critical current density, a bulk property, measures the largest current that can pass through a superconductor without any loss of superconductivity while flux penetration depth measures the penetration of the magnetic field into the material (distance at which the field has decayed to the first critical field (HCl) ) The two parameters are closely related and depend upon magnetic field when the first critical field value is exceeded. Previously, the measurement of transport critical current density has been performed either by electrically contacting the surface of the superconductor material or "contactless" magnetization techniques.

The method of passing current through attached leads inevitably leads to loss of superconductivity through Joule heating at the resistive contacts before true critical current density has been achieved. On the other hand, the contact-less magnetization technique is subject to inaccuracies when the superconductor material sampled is distorted by localized magnetization currents.

STATEMENT OF THE INVENTION

A method for measuring transport critical current density $J_c$ and flux penetration depth P in a bulk superconductor is provided in accordance with the invention. A compressor and a plunger are first formed of superconductor material, the compressor including a hollow interior adapted to receive the plunger and leaving a predetermined clear space therebetween when the plunger is inserted into the compressor.

An external magnetic field is applied to the compressor so that a magnetic field is trapped within the hollow interior of the compressor. The external field is then removed and the magnetic flux density $B_i$ initially trapped within the hollow interior is measured. The plunger is then inserted within the hollow interior of the compressor and the flux density $B_f$ of the magnetic field trapped within the predetermined clear space area is measured. The measured values of $B_i$ and $B_f$ are then utilized to determine $J_c$ and P.

These and many other features and advantages of the invention will become apparent as the invention becomes better understood by reference to the following description.

BRIEF DESCRIPTION OF THE DRAWINGS

FIG. 1 is a perspective view of test apparatus for use in the invention;

FIG. 2 is a top plan view of such test apparatus;

FIG. 5 is a graph of the relationship between the compression ratio R and the initial magnetic flux density Bi for comparison to the theoretical values thereof derived from the critical state model; and FIG. 6 is a graph of transport current density versus magnetic flux density determined in accordance with the teachings of the invention.

DETAILED DESCRIPTION OF THE INVENTION

Figure 3:
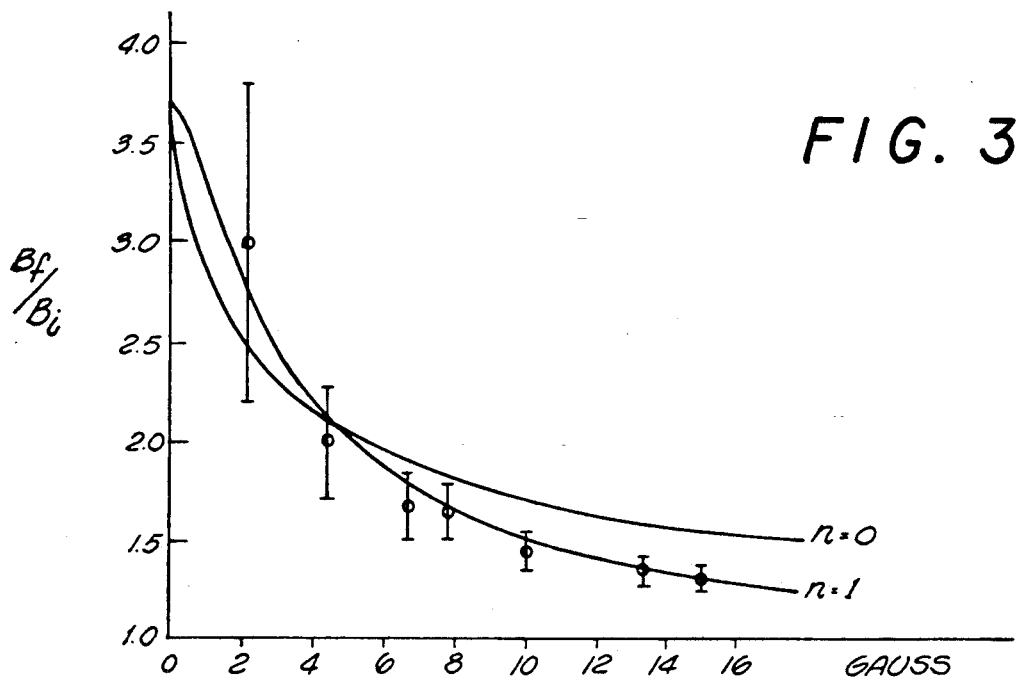
FIGS. 3A and 3B are elevation views of the test apparatus with the spatial distributions of magnetic flux density with respect to the compressor and plunger indicated thereon (uncompressed state)

FIG. 1 is a perspective view of test apparatus for use in the method of the invention. Such method is directed to determination of transport critical current density and flux penetration depth in a bulk semiconductor. As shown, such apparatus generally comprises a cylindrical compressor 10 having a hollow interior defining a region 12 for selectively accepting a plunger 14 therein. A Hall probe 16 is fixed to the inner wall of the compressor 10. As is well-known, such a device provides for voltage output proportional to the magnetic flux density B in the region of the probe 16. A length wise aperture 18 in the plunger 14 accommodates and provides clearance between the probe 16 and the plunger 14 so that the travel of the plunger 14 is unimpeded relative to the compressor 10. As an alternative, a cutout region in the inner wall of the compressor 10 might be provided for fixing the probe 16 thereto and allowing unimpeded travel of the plunger 14.

Both the compressor 10 and the plunger 14 are formed from a superconducting material, either HTS or otherwise. The analysis below is based upon the cylindrical geometries of the compressor 10 and the plunger 14 as illustrated in FIG. 1. However, it will be appreciated that the test apparatus is not so limited. Rather, while the analysis will differ in a manner that will become apparent to one skilled in the art, the concepts of the invention may be extended to other geometries. That is, in theory test apparatus for practicing the method of the invention is limited only insofar as the compressor 10 and the plunger 14 must both be formed of superconducting material (either the same or a hybrid arrangement of two different superconductors where one is well understood), with the compressor 10 providing an internal chamber region 12 for insertion to thereby fill the chamber 12 while allowing an area of so-called clear space therebetween.

As mentioned above, a hybrid test apparatus may be employed only in the event that one of the two superconductors is well understood. For example, niobium is known to have a $B_{cl}$ of about 2000 Gauss so that no flux penetration will occur below that field value. The analysis of such a test arrangement will vary somewhat from that set forth below. In the event that a non-HTS material is used with HTS material, the hybrid should be tested at liquid helium temperatures.

FIG. 2 is a top plan view of the test apparatus. As one can see, a peripheral, band-like clearance 20, when added to the longitudinal aperture 16 of the plunger 14 defines the clear space interior to the compressor 10 when the plunger 14 is inserted or seated therein. In the discussion to follow, it will become apparent that the method of the invention relies upon the measurement of magnetic flux density $B_i$ within the interior region 12 of the compressor 10 in a so-called "uncompressed" (or "initial") configuration and the magnetic flux density $B_f$ within the clear space comprising the aperture 16 and the peripheral band 20 in a so-called "compressed" (or "final") configuration of the plunger 14 relative to the compressor 10.

FIGS. 3A and 3B are elevation views of the test apparatus with the spatial distributions of magnetic flux density (uncompressed state) with respect to the compressor 10 and the plunger 14 respectively indicated across their profiles. The flux density profiles that are illustrated are linear, corresponding to the critical state equation with n=0 (discussed below.)

The initial magnetic field $B_i$ is trapped in the hollow interior 12 of the compressor 10 by application of an axial external magnetic field B. (The external magnetic field is applied by means of a solenoid 22. The Meissner effect complicates the trapping of a magnetic field within a superconductor. Accordingly, one of two techniques must be employed to generate the compressor 10 field profile of FIG. 3A. In one, the compressor 10 is gradually cooled below its superconducting transition temperature in the presence of a magnetic field. Otherwise, a (larger) field must be applied to, in effect, penetrate into the interior 12 while the compressor 10 is already in a superconducting state.

The external field is then turned off and the plunger 10 is inserted into the interior 12 to compress the magnetic flux. When the plunger 14 is removed, the magnetic flux density profile of FIG. 3B is induced therein. As noted in FIG. 3B, peaks of magnetic flux density of magnitude $B_f/2$ are induced at the edges of the wall of the plunger 14 while peaks are observed within the wall of the compressor 10 that decay linearly (due to the n=0 assumption, corresponding to a transport critical current density that is independent of magnetic flux density) to a magnetic field of uniform flux density $B_i$ at the hollow interior 12 of the compressor 10 (FIG. 3A).

Figure 4:
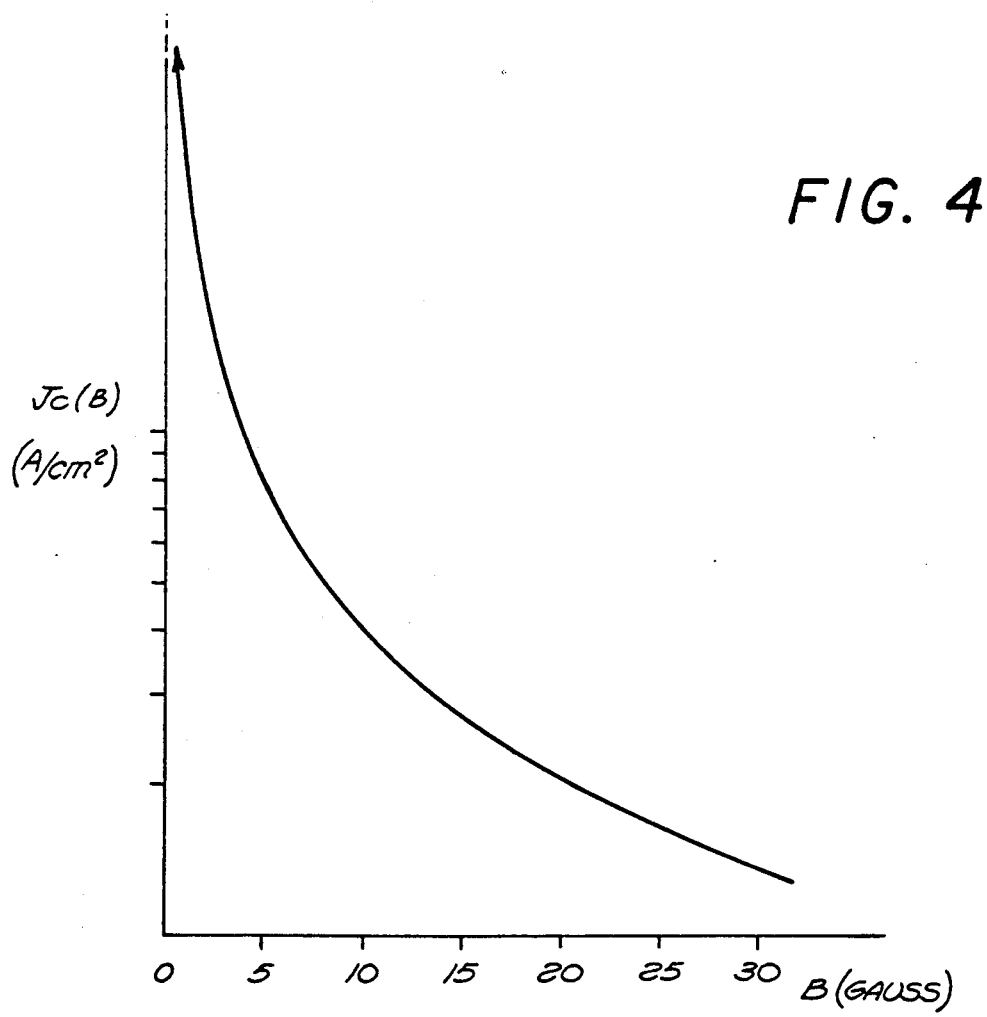
FIG. 4 is an elevation view of the test apparatus with the distribution of magnetic flux density indicated thereon (compressed state)

FIG. 4 is an elevation view of the test apparatus with the spatial distribution of magnetic flux density indicated for the compressed state in which the plunger 14 is inserted within the compressor 10 as shown. The total amount of magnetic flux before and after compression is identical. However, the area available to the flux is much less in the compressed state. Accordingly, a much larger magnetic flux density (or magnetic field) is obtained. The shaded areas of FIG. 4 indicate the magnitude and location of the increase in flux density that occurs as a result of the compression of the flux as the free space within the compressor 10 is drastically reduced to the clear space comprising the thin circular band area 20 and the aperture 18 of the plunger 14. By locating the Hall probe 16 at the interior wall of the compressor 10, this device is able to measure the two values of magnetic field that characterize the "initial" and "final" states of the test apparatus since the maximum field $B_f$ is confined to the region adjacent the inner wall while $B_i$ is uniform throughout the hollow interior of the compressor 10.

By successively trapping and compressing larger fields, compression data may be obtained as a function of initial trapped magnetic field for a given sample. As the compressed field is increased, it extends further and further into the interior of the bulk superconductor. At a compressed field, B, the transport current trapped in the compressor 10 is the critical current density at that field. From the known geometry of the compressed field, the flux penetration depth and critical current density may be calculated in accordance with the invention using the critical state model and the measurements obtained from the test apparatus.

The test apparatus of the invention is arranged to provide data representative of the compression ratio $R = B_f/B_i$ which may be plotted against the uncompressed field $B_i$. The critical current density may then be obtained from such data once an expression is derived which relates R and $B_i$ to $J_c$. The solution of such relationship will vary in accordance with the geometry of the test apparatus.

Regardless of the specific geometry of the test apparatus, $J_c$ may be assumed to be of the form:

$$J_c(B) = c_1(B_{cl}/B)^n, \quad B > B_{cl} \tag{1}$$

where $B_{cl}$ is the first critical field of the superconductor. The critical state model prediction corresponds to n=1. Referring now to the geometry of the test apparatus, the boundary condition from Maxwell's equation for a cylindrical geometry provides:

$$dB/dr = -\mu_o J_c = -\mu_o J_{cl}(B_{cl}/B)^n \tag{2}$$

which for a tube of inner radius $r_o$ and $B >> B_{cl}$ integrates to:

$$\begin{aligned} B(r) &= B_o\{1 - [((n + 1)\mu_o J_{c1}B_{ncl}/B_o^{(n+1)})](r - r_o)\}^{1/n+1} \\ &= B_o[1 - (r - r_o)/P_o]^{1/n+1}, \quad r \geq r_o \end{aligned} \tag{3}$$

where $$P_o = B_o/(n+1)\mu_o J_c(B_o) \tag{4}$$

is the flux penetration depth at an applied magnetic field $B_o$.

Denoting $r_L$ the compression hole radius, $r_p$ the plunger radius and $r_s$ the radius of the hole where the field is measured, the expressions for the flux available before and after compression become:

$$\Phi_i = \pi B_i r_L^2 \quad (5)$$

$$\Phi_f = \pi B_f [(r_L - r_p)^2 + r_s^2] + \Delta\Phi_p + \Delta\Phi_c \quad (6)$$

where $\Delta\Phi_p$ and $\Delta\Phi_c$ are the flux changes in the plunger 14 and the compressor 10 respectively between the compressed and uncompressed states shown by the shaded areas in FIG. 4.

The flux changes are obtained by integrating the penetrated magnetic fields across the cross sectioned area of the geometry The results are:

$$\Delta\Phi_p = \pi B_f P_f (n+1)/(n+2)](r_p + r_s) \quad (7)$$

$$\Delta\Phi_c = \quad (8)$$

$$\pi B_f P_f (n + 1)/(n(n + 2)]\{r_L(1 - 1/R^{n+1})\exp(n + 2)/(n + 1) +$$

$$(n + 1)/(2(2n + 3))P_f(1 - 1/R^{n+1})\exp(2n + 3)/(n + 1)\}$$

As mentioned above, the initial flux is equal to the final flux. Accordingly, the following expression is obtained:

$$1/R = 1/r_L^2\{(r_L - r_p)^2 + r_s^2 + P_f[(n + 1)/(n + 2)[r_p + \quad (9)$$

$$r_s + r_L(1 - 1/R^{n+1})\exp(n + 2)/(n + 1) +$$

$$[(n + 1)/2(2n + 3)P_f(1 - (1/R^{n+1})\exp(2n + 3)/(n + 1)]\}$$

where $$P_f = (R^{n+1} w B_i^{n+1}/B_{max}\exp(n+1)\} \quad (10)$$

$P_f$ is the flux penetration depth at compression. The expression includes the parameters w representing the minimum wall thickness of the compressor 10 and $B_{max}$ which is the experimentally determined maximum magnetic field that can be applied before the field penetrates across w. $B_{max}$ and w set the scale for the flux penetration in a given material and a given geometry.

Equation 9 may be solved on a computer for R as a function of the initial field $B_i$. FIG. 5 is a graph of the relationship between the compression ratio and the initial magnetic flux for comparison of theoretical values thereof derived from the critical state model. Solutions of equation 9 for n=1 and n=0 along with experimental data using sintered $YBa_2Cu_3O_7$ (at 77 degrees Kelvin) are plotted on the graph. As can be seen, the data is consistent with a $J_c$ varying inversely with B. The graph demonstrates a relatively good fit between the theoretical and experimental data for the critical state model (n=1).

FIG. 6 is a graph of transport current density versus magnetic flux density determined in accordance with the teachings of the invention. The desired expression relating $J_c$ to R and $B_i$ is obtained by equating equations 4 and 10 and using the experimentally-derived values of R and $B_i$. The resolution obtained was about ±0.5 Gauss (DC/Hall-probe resolution) so that the extraction of data from sintered samples that can only trap fields below about 25 Gauss is limited to resolutions in the flux compression ratio of about 27 percent at an initial field of 2 Gauss, 10 percent at an initial field of 6 Gauss and 5 percent at an initial field of 14 Gauss. Melt processed HTS samples may support critical current densities about two orders of magnitude larger than sintered samples. Accordingly, resolution of better than 1 percent at low initial field values and between than 0.1 percent at large initial field values may be expected. Even further improvement and resolution may be obtained by reading the magnetic fields with an a.c. method.

As mentioned above, equation 10 provides a straightforward relationship between the data points R and $B_i$ obtained by means of the test apparatus. Accordingly, flux penetration depth is readily provided and available in accordance with the teachings of the invention.

Thus, it is seen that the present invention provides an improved method for measuring both the transport critical current densities and flux penetration depth in bulk superconductor materials. By employing the teachings of this invention, one may obtain reliable measurements of such critical parameters without effecting the loss of superconductivity.

While this invention has been described with reference to its presently preferred embodiment, it is not limited thereto. Rather, this invention is limited only insofar as described by the following set of claims and includes all equivalents thereof.

What is claimed is:

1. A method for measuring transport critical current density $J_c$ and flux penetration depth P in a bulk superconductor comprising the steps of:
    a) forming a compressor and a plunger of superconductor material, said compressor including a hollow interior adapted to receive said plunger leaving a predetermined clear space therebetween when said plunger is inserted into said compressor; then
    b) applying an external magnetic field to said compressor and cooling said material below its superconducting transition temperature so that a magnetic field is trapped within said hollow interior; then
    c) removing said external field; and
    d) measuring the magnetic flux density $B_i$ initially trapped within said hollow interior of said compressor; then
    e) inserting said plunger within the hollow interior of said compressor; and
    f) measuring the magnetic flux density $B_f$ of the magnetic field trapped within said predetermined clear space; and then
    g) utilizing said measured values of $B_i$ and $B_f$ to determine $J_c$ and P.

2. A method as defined in claim 1 comprising the additional steps of:
    a) applying successively larger magnetic fields to said compressor whereby fields of successively larger magnetic fields are trapped within said hollow interior; and
    b) repeating steps (c) through (g) of claim 1 for each of said successively larger magnetic fields.

3. A method as defined in claim 1 further characterized in that
    a) said compressor is cooled below its superconducting transition temperature prior to application of said external magnetic field.

4. A method as defined in claim 1 further characterized in that said external magnetic field is applied to said compressor while said compressor is cooled from above its superconducting transition temperature to below said temperature.

5. A method as defined in claim 1 wherein the step of forming said material into a compressor and a plunger is further characterized in that:
   a) said compressor is generally cylindrical; and
   b) said plunger is generally cylindrical.

6. A method as defined in claim 5 wherein said compressor and said plunger are fabricated of an HTS material.

7. A method as defined in claim 6 wherein said HTS material is $YBa_2Cu_3O_7$.

8. A method as defined in claim 5 wherein said compressor and said plunger are fabricated of two different HTS materials.

9. A method as defined in claim 8 wherein the characteristics of one of said HTS materials is known.

10. A method as defined in claim 5 wherein said compressor and said plunger are fabricated of non-HTS superconductor materials.

11. A method as defined in claim 5 further characterized in that:
   a) one of said plunger and compressor is fabricated of an HTS material and the other is fabricated of a non-HTS material; and
   b) the characteristics of one of said materials is known.

* * * * *